United States Patent [19]

Zeitlin et al.

[11] Patent Number: 5,027,255

[45] Date of Patent: Jun. 25, 1991

[54] HIGH PERFORMANCE, HIGH CURRENT MINIATURIZED LOW VOLTAGE POWER SUPPLY

[75] Inventors: Dan B. Zeitlin, Annapolis; John B. Branthover, Daytona; Brian H. Smith, Easton; Andrew J. Piloto, Columbia; Theresa M. Lengel, Ellicott City; Robert R. Carlson, Jr., Severn; Lanson Y. Shum, Highland; Paul D. Hodges, Jr., Ellicott City; Denise B. Harris, Columbia, all of Md.

[73] Assignee: Westinghouse Electric Co., Pittsburgh, Pa.

[21] Appl. No.: 424,102

[22] Filed: Oct. 20, 1989

[30] Foreign Application Priority Data

Oct. 22, 1988 [JP] Japan .................................. 63-266648

[51] Int. Cl.$^5$ .............................................. H05K 1/14
[52] U.S. Cl. .................................... 361/395; 361/398; 361/414; 361/415; 363/141
[58] Field of Search ............... 361/392, 395, 397, 398, 361/399, 412, 414, 415; 363/141, 144, 147

[56] References Cited

U.S. PATENT DOCUMENTS

| | | | |
|---|---|---|---|
| 3,766,634 | 10/1973 | Babcock et al. | 29/471.9 |
| 4,622,627 | 11/1986 | Rodriguez et al. | 363/147 |
| 4,670,771 | 6/1987 | Neidig et al. | 361/389 |
| 4,712,161 | 12/1987 | Pryor et al. | 361/411 |

Primary Examiner—Steven L. Stephan
Assistant Examiner—Jeffrey Sterrett
Attorney, Agent, or Firm—W. G. Sutcliff

[57] ABSTRACT

A high performance, high current, miniaturized low voltage power supply is disclosed which employs a thick copper-ceramic film primary board, a direct bonded copper secondary, flexible printed circuit power inductors, the power supply has high power leadless chip carriers, hybrid rectifier packages and various electrical circuits including application specific integrated circuits for control, a turn on protection and current sharing.

13 Claims, 9 Drawing Sheets

HIGH PERFORMANCE, HIGH CURRENT MINIATURIZED LOW VOLTAGE POWER SUPPLY

BACKGROUND OF THE INVENTION

1. Field of the Invention

The invention relates to power supplies and, in particular, to a modularized low voltage, high current power supply with improved performance.

2. Description of the Prior Art

The military has demanded that its suppliers develop systems using replaceable standard electronic modules (SEMs) as building blocks in various avionics packages. In general, SEMs standardize the size, interface, and configuration of various units within a system. This, in turn, eases rework in the field, reduces costs and eases equipment upgrades. Further, modules can be pulled out and replaced with new ones without having to redesign or change the rack or the chassis. Because every rack in a system requires power, the development of a low cost, high reliability so-called SEM-E format low voltage power supply (LVPS) having a high current capability is an important step in the accomplishment of modularity.

Overall, SEM format "E" packages conform to a 6.4"×5.88"×5" outline with wedge locks on opposite narrow rails, a distal connector bus and a proximate extractor. Any particular design must fit all the components into the specified outline and provide good thermal management while at the same time meeting military specifications and cost restraints.

Low voltage power supply (LVPS) efficiency is degraded by the internal conduction losses occurring in the distribution of typically high currents through such systems. The high current manifests itself in heat loss in the various power supply components, including power switches, magnetic devices, rectifiers, transformers and the bus bars. The heat generated causes elevated temperature which in turn degrades reliability and efficiency.

A conventional LVPS contains a large number of interconnects usually round wires and various connectors. There are also numerous separate components required to regulate and control the various power supply functions. These factors increase cost and degrade reliability and result in volume inefficiencies.

Among the most complex and costly components are magnetic assemblies for transformers and inductors. These components are traditionally labor intensive and difficult to manufacture consistently with a high yield.

SUMMARY OF THE INVENTION

In a preferred embodiment, the invention is directed to a low voltage, high current power supply adapted to be secured in thermal contact with a modular SEM chassis. The power supply comprises a thick film copper-ceramic primary board for supporting power switches, the house supply, a regulator and a controller and integral connections therebetween. There is also provided a direct bonded copper (DBC) secondary board for supporting output rectifiers and capacitors while carrying high output currents Inductive power components are formed of planar flexible printed metal windings and an encapsulating flexible insulating substrate. A set of magnetic cores formed of monolithic components receive the windings therein.

In one embodiment of the invention the thick-film copper ceramic primary board comprises at least one film of selectively apertured dielectric and copper located in the apertures forming thermal vias alternating with a patterned thick copper film on the dielectric overlying the thermal and electrical vias. The invention employs leadless chip carriers (LCC) which are adapted to be soldered to the primary board in selected locations. The LCCs include a patterned gold film formed on a rear surface thereof, the pattern corresponding to the pattern of thermal vias made from thick-film copper.

The LCC comprises, in one form, an aluminum nitride (AlN) thermal base supporting an integrated circuit on one side and being patterned with the gold film on the opposite side and an $Al_2O_3$ apertured ring being bonded to the AlN by a Cu/Ag braze. In another form the LCC comprises a copper tungsten (CuW) thermal base for supporting the integrated circuit on one side and the patterned Au film on the opposite side and an apertured $Al_2O_3$ ring having a stepped portion for receiving the thermal pad therein and being bonded to the ring by an Ag/Cu braze on the chip side.

The direct bonded copper (DBC) board comprises an alumina core and directly bonded copper surfaces. One copper surface is adapted for surface mounting capacitors and at least one rectifier hybrid package and is a thickness sufficient to carry the relatively high currents produced by the components. The opposite side of the DBC is a copper layer adapted to be in thermal contact with the SEM chassis having a thickness sufficient to spread and conduct heat to the chassis from the hybrid.

The hybrid package comprises an alumina stepped ring and a highly thermally conducting base being Cu/Ag brazed to the lower face of the ring. A cover of similar material is AuSn soldered to the upper face. The base is adapted to support Au/Ge soldered diodes and an alumina substrate also Au/Ge soldered to the base for supporting a capacitor or other components which are to be electrically insulated from the conducting base. Metallization in the step is coupled to the top. Preferably the base and cover are formed of a sintered copper molybdenum (moly) alloy which is referred to sometimes as CM-15.

The inductive components including power inductors, transformers and the like are formed of at least one layer of flexible printed windings and a flexible insulating substrate encapsulating the windings. The windings and encapsulation are precision formed and consistent. A magnetic core is machined or molded from monolithic components for receiving the windings therein. When multiple layers of windings are employed, spacers may be provided to separate the windings for reducing or controlling inter-winding capacitance. In the preferred embodiment the power indicators handle 300 watts of power.

Various electrical circuits are employed to protect and control the power supply herein described. One circuit provides a pulse drive signal to a transformer to control the power switches. Another circuit is employed to allow a plurality of power supplies to operate together in synchronization and at the same output current level. An application specific integrated circuit (ASIC) incorporating the aforementioned circuits is employed to control the power supply and guard against overvoltage and overcurrent conditions.

DESCRIPTION OF THE PREFERRED EMBODIMENT

Figure 1:
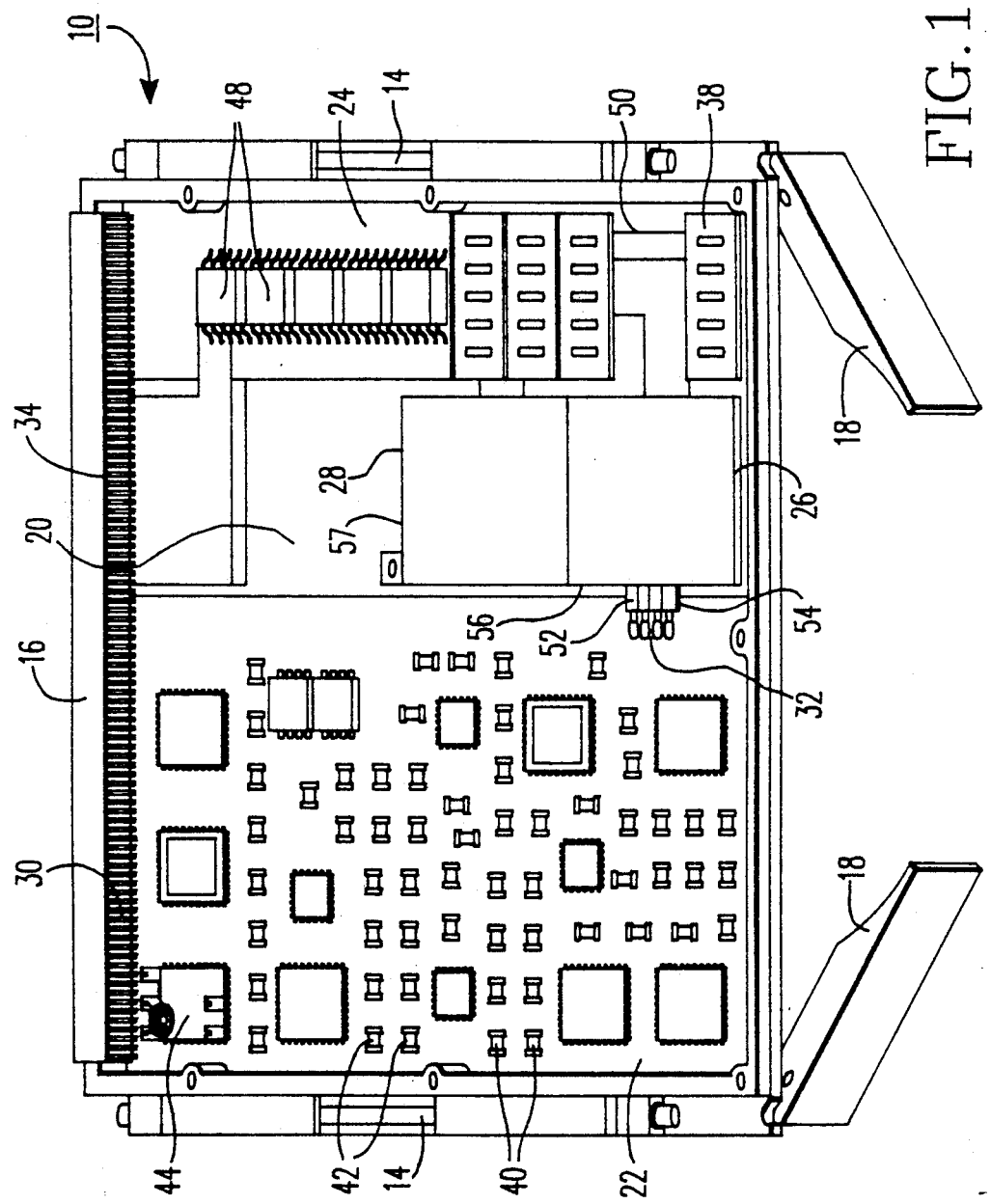
FIG. 1 is a perspective view of a high performance, high current miniaturized low voltage power supply in a SEM-E module according to the present invention.

The present invention may be generally described as a modularized low voltage, high current power supply (LVPS) 10 illustrated in FIG. 1. In accordance with the invention the LVPS 10 is housed within a standard electronic module chassis 12 which is in the form of a machined box 6.4"×5.88"×0.5". SEM chassis 12 includes a pair of wedge locks 14 on the lateral sides, a connector bus 16 on the distal side and a pair of extractors 18 on the proximal side. The SEM 12 is designed to fit into a standardized rack (not shown) but which is known in the art.

Power supply components are located within the recess 20 of the SEM chassis 12. The components include a primary or input board 22, a secondary or output board 24 and power transformer 26 and a power inductor 28.

The primary board 22 is connected to the bus 16 by means of soldered pads 30 and is connected to the primary side of the transformer 26 by the soldered pad connections 32. The output board 24 is connected to the bus 16 by soldered pads 34 and to the secondary side of the transformer 26 by the relatively large lapped soldered connections 36. The power inductor is similarly connected to the output board 24 by lapped soldered connections 38.

The primary board 22 supports a number of components which are surface mounted thereto. As shown in FIG. 1 the surface components include resistors, and capacitors 40 and 42, inductors 44, diodes and leadless chip carriers LCCs 46 which have integrated circuit chips and discrete transistors (not shown) carried therein as will be hereinafter described. In a preferred embodiment of the invention the primary board 22 supports power switches, a so-called house or internal power supply, a regulator and a controller. In addition, the construction of the primary board 22 is such that interconnects among components are integrally formed in the board construction as hereinafter described. Also, an application specific integrated circuit (ASIC) also hereinafter described is carried by one of the leadless chip carriers 46.

The primary board 22 is a thick film copper ceramic structure comprising at least two but preferably many alternating layers of thick film copper and an apertured dielectric having copper located in the apertures.

The secondary board 24 supports a plurality of output capacitors 48 which are preferably low ESR ceramic structures. The output board 24 also supports rectifier hybrid packages 50 which are directly soldered on the board 24 and have interconnections with the transformer 26 and the power inductor 28.

The secondary board 24 is formed of a direct bonded copper DBC structure which is hereinafter described in detail but which in general includes an $Al_2O_3$ core and directly bonded copper external layers.

The transformer 26 and power inductor 28 are formed with flexible printed circuit windings 52 which are encapsulated in a controlled thickness flexible insulated encapsulating substrate 54. The windings 52 are secured within a core 56 formed of monolithic portions hereinafter described in detail. The primary board 22, the secondary board 24, the transformer 26 and inductor 28 are bonded to the SEM chassis 12 by a thermally conductive epoxy 57. Heat generated within the various components is conducted to the chassis 12. The arrangement illustrated in FIG. 1, for example, provides approximately 300 watts of power while remaining within military specifications for size and performance at low cost.

Figure 2:
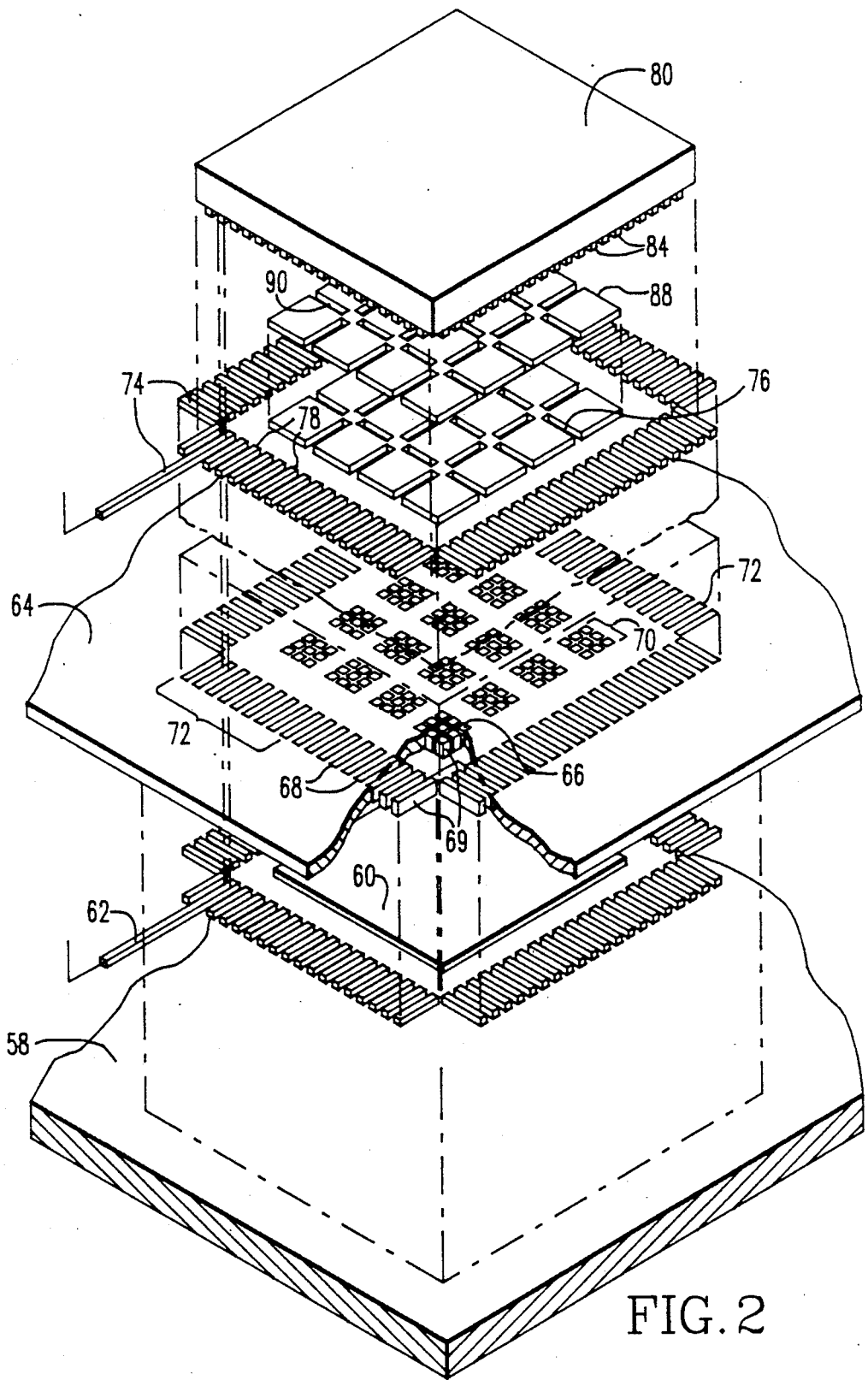
FIG. 2 is a fragmentary exploded schematic diagram illustrating the details of the thick-film copper primary board.
Figure 3:
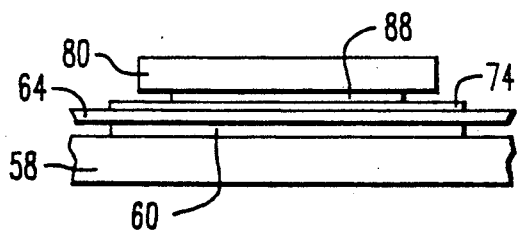
FIG. 3 is a fragmentary side sectional view of the primary board.

A more detailed description of the primary board 22 is illustrated in FIGS. 2 and 3. An underlying alumina ($Al_2O_3$) substrate 58 forms a main support for the structure of the primary board as hereinafter described. The substrate 58 may be approximately 25 mils thick (0.025 inches). A first metal plane or layer 60 and selected interconnects 62 are printed on the substrate 58 in the form of thick copper films which are thereafter fired at 900° C. in a nitrogen atmosphere. Thereafter, a first apertured dielectric (glass) layer 64 is printed over the metal 60 and the interconnects 62. The apertures in the dielectric layer 64 are generally divided into two groups namely clustered thermal apertures 66 and peripheral electrical apertures 68. The thermal apertures 66 are clustered in close square-like patterns as shown and the electrical apertures 68 are located about the thermal apertures 66 as shown. After firing at 900° C. in a nitrogen atmosphere the apertures in the dielectric layer 64 are filled with copper thick film 69 and fired at 900° C. in a nitrogen atmosphere to form thermal vias 70 and electrical vias 72. The next layer of metal 60 and interconnects 62 are then applied. The processes continues for as many times as is desired or necessary by the particular design. The structure is mechanically strengthened by solid metal planes or layers 60 placed adjacent opposite sides of the thermal vias 70. The metal layers 60 spread heat to the thermal vias 70.

In a preferred embodiment a top metal layer 74 is somewhat different from the first metal layer 60 and intermediate metal layers not shown. Electrical interconnects 78 are also provided in top metal layer 74. The top metal layer 74 is patterned as shown with a plurality of slots 76 therein The slots define squares which generally correspond with the clustering of the thermal vias 66. The purpose of the slots 76 is hereinafter described. However, a brief description of a surface mounted LCC 80 proceeds such explanation.

The perimeter of the LCC 80 has a plurality of printed gold castellations 84. The castellations 84 correspond with the various positions of the electrical contacts 78 in the top film 74. The underside 82 of the LCC 80 also has printed thereon a gold pattern 88 with slots 90 which corresponds to the slotted pattern on the top metal layer 74. The LCC 80 is soldered to the top metal layer by means of a tin/lead solder at a suitably elevated temperature. The purpose of the slots 76 in the top metal layer 74 and the slots 90 in the gold layer 86 is to break up the solder and allow for more even and uniform wicking across the surface. The slots 76 and 90 thus allow for a stronger bond with a much thinner (not bumpy) solder bond between the two structures. Further the thermal path between the metal layers 74 and 88 is enhanced.

In accordance with the invention interconnection between the components on the primary board 22 is accomplished by means of electrically isolated connections 78 which are in the form of copper thick film. Interconnect apertures 68 in the dielectric layer 60 may be likewise copper filled to form electrical vias 72 in the same way as the thermal vias 70. Circuit interconnects 78 may be printed on the dielectric layer 64 for allowing layer to layer and component to component interconnects so that no discrete wires are necessary between any of the LCCs and other components thereby greatly simplifying the construction of the present invention.

In accordance with the invention, heat generated in the LCC by an operating device (not shown) is transferred through the gold layer 88 and solder bond to the top metal layer 74. Heat is transferred through the thermal vias 70 to the next metal layer 60 and so on to the alumina substrate 58. The close or dense clustering of the thermal vias 70 is arranged to be directly below that portion of the LCC 80 which supports the integrated circuit, not shown. Heat generated in the IC is thus conducted away efficiently.

The electrical vias 72 permit selective interconnection of the interconnects 62 and 78 from any LCC 80, for example, to any other component on the board 22 by routing around and under adjacent devices. Thus, in accordance with the present invention discrete wiring between components is unnecessary, thereby reducing the cost of manufacture significantly and increasing reliability mainly because the process is at first automated by printing and second because the various interconnects 62 and 78 formed in the primary board 22 may be independently checked before any components are mounted thereon. It should be understood that the castellations 84 are similarly soldered to the various electrical connections 78 on the top metallization layer 74.

Figure 4:
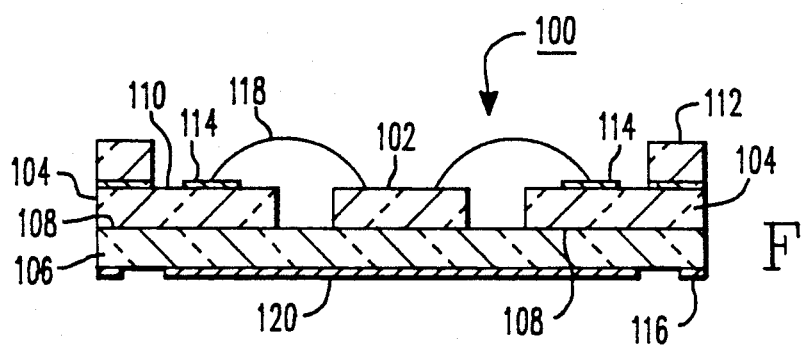
FIGS. 4 and 5 are side sectional views of leadless chip carriers according to various embodiments of the invention.
Figure 5:
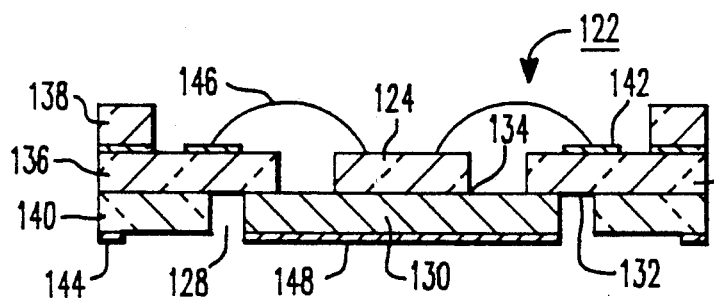

In accordance with the present invention and in order to enhance thermal management leadless chip carriers LCCs of the kind described in FIGS. 4 and 5 are described. In FIG. 4 the leadless chip carrier 100 is adapted to carry a relatively large integrated circuit 102. The LCC 100 comprises a 96% alumina ring 104 bonded to an aluminum nitride AlN base 106 by a copper silver braze along the interface 108. The alumina ring 104 is formed of a first stepped portion 110 bonded by a glass frit to an upper relatively narrow alumina frame 112. The stepped portion 110 has contact pads 114 which are connected to the external castellations 116 on the aluminum nitride base. Bonding wires 118 connect the integrated circuit 102 to the contact pads 114 and thus to external circuits via the castellations 116 in a surface mounting configuration. A gold metal layer 120 is deposited on the lower surface of the aluminum nitride base 106. The pattern of the gold layer 120 is similar to the pattern described in FIG. 2 for the layer 88 and the top metal layer 74 for surface mounting the LCC onto the primary board 22. The aluminum nitride base 106 is an electrical insulator that has a sufficient heat transfer characteristic that heat generated in the integrated circuit 102 is readily transferred to the gold layer 120 and thence to the board 22 as hereinbefore described.

Typically the arrangement in FIG. 4 is used for relatively large integrated circuits where any mismatch in the thermal coefficient of expansion of the various materials must be carefully considered. For example, the LCC 100 in FIG. 4 is adapted for use with a large area IC having a corresponding number of castellations 116. The temperature coefficient of expansion of the aluminum nitride base 106 is compatible with that of the integrated circuit 102 so as to prevent thermal mismatch and thus potential failure of the device.

In contrast, the LCC 122 illustrated in FIG. 5 is adapted for a higher heat transfer characteristic but is more limited in the size of the integrated circuit 124 which may be used. FIG. 5 is a so-called 20/28 pin LCC which is formed of a stepped 90% alumina frame 126 which has a recess 128 in the rear side thereof and a copper/tungsten base 130 which is copper silver brazed to the rear side 132 of the recess 128 as shown. The integrated circuit 124 is attached to the copper/tungsten base 130 by eutectic attachment 134.

The alumina frame 126 is comprised of a central frame portion 136, a narrower upper frame portion 138 and a lower frame portion 140. Bonding pads 142 are deposited on the upper surface of the central frame portion 136 and are connected with the castellations 144 on the lower frame member 140. The bonding wires 146 couple the bonding pads 142 to the IC 124.

A thermal pad 148 formed of gold is printed on the lower side of the copper/tungsten base 130. The gold thermal pad area has a pattern similar to the top metal layer 74 illustrated in FIG. 2. In both the arrangements of FIGS. 4 and 5 the respective thermal pads 120 and 148 are tin/lead soldered to the top metal layer as hereinbefore mentioned.

The copper/tungsten base 130 in FIG. 5 is electrically and thermally conductive. In those instances in which electrical isolation between the lower side of integrated circuit 124 and external circuits is unnecessary, the electrically conductive pad such as the copper/tungsten base 130 may be utilized. The copper/tungsten alloy has a high thermal conductivity which allows for the dissipation of heat from the IC 124 rapidly. In the arrangement of FIG. 4, on the other hand, while the aluminum nitride base 106 has a lower conductivity it acts as an insulator in those cases in which the IC must be electrically isolated from the board 22.

The table below sets forth the preferred materials for the LCCs 100 and 122 described above.

TABLE

| Part | material | Tc w/mk | TCE |
|---|---|---|---|
| 44 PIN LCC 100 | | | |
| Frame 104 | 96% Al₂O₃ (cofired high temp alumina tape) | 25 | 6.7 |
| Base 106 | ALN | 170 | 4.5 |
| 20/28 Pin LCC | | | |
| Frame 126 | 90% Al₂O₃ (cofired high temp alumina tape) | 25 | 7 |
| Base 130 | Cu/W alloy | 209 | 6 |

Figure 6:
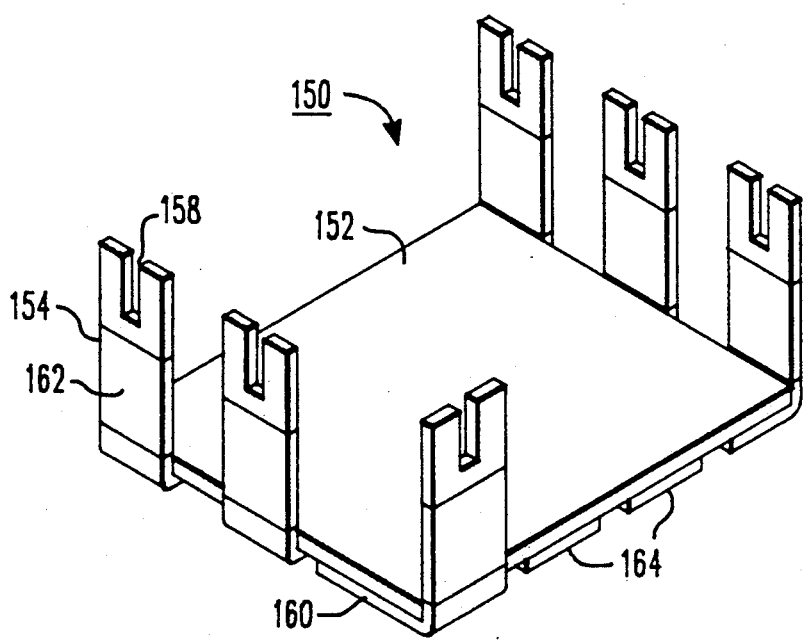
FIG. 6 is a perspective view of a surface mounting device for supporting wired components.

FIG. 6 is a perspective view of a surface mounting device 150 which is designed to support components which may not normally be surface mounted. For example, a wire wrapped inductor may be assembled and attached to the surface mount device 150 and thereafter surface mounted to the primary board 22. In the arrangement of FIG. 6 the surface mount device 150 includes an alumina insulator 152 and a plurality of upstanding slotted metal tabs 154. The surface mount device is comprised of direct bond copper tabs 154. In the preferred embodiment, the tabs 154 are formed of copper, plated with nickel/tin. Upstanding portions 156 of the tabs 154 are formed with slots 156 for receiving round wires and the like therein for a solder connection. A portion 162 of the upstanding leg 156 may be masked as shown for providing electrical isolation. A lower portion of the device 150 also includes one or more thermal pad areas 164. The exposed portions of the short leg 160 and the thermal pad areas 164 may be directly soldered to the primary board 22 by an appropriate soldering compound such as tin/lead. The short legs 160 may be soldered directly to electrical vias 74 whereas the thermal pad areas 104 may be aligned with thermal vias 70 to remove heat. In the arrangement illustrated in FIG. 6 devices such as switches, coils, or light emitting diodes having wire connections may be readily attached to the mounting device 150 and thereafter surface mounted to the primary board 22. The arrangement reduces manufacturing costs and increases reliability because such a subassembly may be tested prior to installation, and hand wiring to or near the primary board becomes unnecessary.

Figure 7:
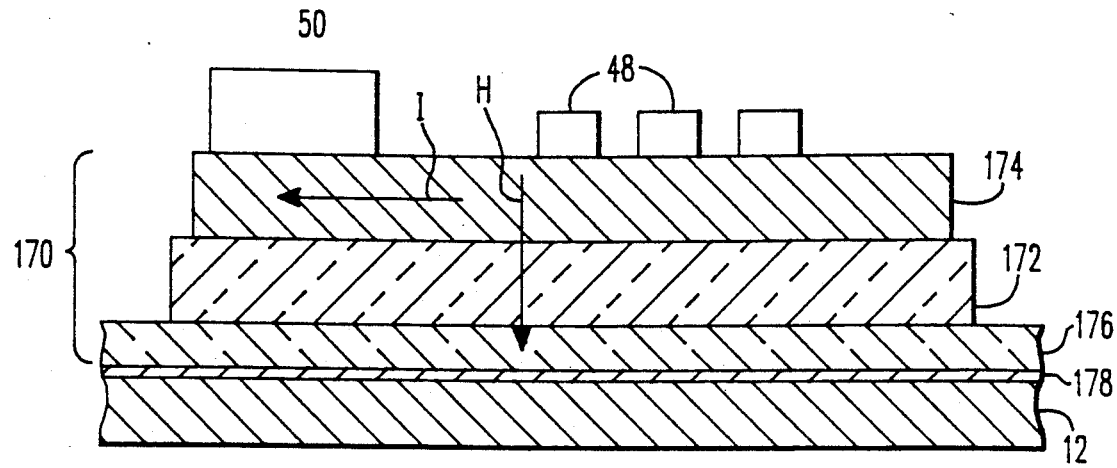
FIG. 7 and 8 are respective fragmentary side sectional and top plan views of the direct bonded copper (DBC) secondary board with some components attached.
Figure 8:
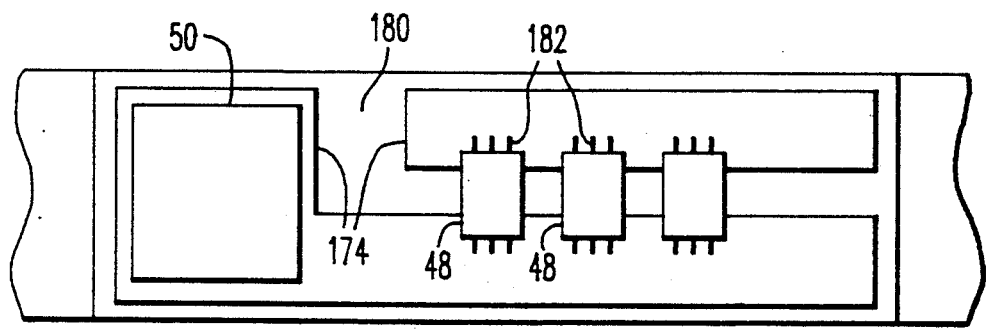

In a preferred embodiment of the present invention, the secondary or output board 24 (FIG. 1) is illustrated in greater detail in FIGS. 7 and 8. The secondary board 24 as noted above, is comprised of a direct bonded copper (DBC) structure 170 which includes an alumina core 172, a direct bonded copper current carrying layer 174 on one face of the core 172 and a direct bonded copper thermal surface 176 bonded to the opposite face of the core 172. The direct bonded copper substrate 170 is attached to the metal chassis of the SEM 12 by a conductive epoxy 178 as shown. Various components such as ceramic capacitors 48 and one or more rectifier hybrid assemblies 50 (see also FIG. 1) are attached to the upper layer 174 by solder and the like. In the top view of FIG. 8, for example, the substrate 170 has a slot 180 to provide electrical isolation between portions of upper surface 174. The capacitors 48 are soldered to the isolated portions of the surface 174 at their opposite terminals 182 as shown and bridge the slot 180 completing part of the output circuit.

The direct bonded copper substrate 170 is a specially prepared structure in which the alumina core 172 and the copper layers 174 and 176 have an oxide layer formed on their exposed surfaces prior to assembly. The components are thereafter sandwiched together and subjected to the heat treatment in which the oxide layers between the abutting parts flow and thereby fuse at a temperature approximately 15° C. below which the pure copper melts. The structure thereby fuses together in an integral package.

In a preferred embodiment the current carrying layer 174 is sufficiently thick such that it is capable of carrying approximately 60 amps of current. The upper layer 174 is about 32 mils (0.032 inches) thick. The alumina core 172 is about 40 mils and the lower heat conducting layer 176 is about 16 mils. In the arrangement illustrated (FIG. 7) current I moves in a direction transverse to the cross-section of the layer 174 as shown and heat H moves perpendicular to the structure in the direction of the SEM chassis 12 as shown. The arrangement of a relatively thick current carrying layer 174 and a relatively thin heat carrying layer 176 along with the alumina core 178 which provides electrical isolation results in a particularly effective and thermally efficient structure.

In a preferred embodiment of the present invention rectifier hybrid package 50 is employed in the output board 24. As used in the art a hybrid package is a device which includes more than one device in a package, for example, integrated circuits, capacitors and diodes. In the arrangement illustrated in FIG. 9 the hybrid package 50 employs a rectifier including a diode 190 and a ceramic capacitor 192 mounted in a housing 194. In the preferred embodiment the housing 194 comprises a stepped alumina frame or ring 196 and a metal base 198 copper/silver brazed to the lower side of the frame 196 as shown. A diode 190 is directly mounted by a gold-/germanium solder to the base 198. The frame 196 has a stepped portion 200 which has a metallization layer 202. The diode 190 is coupled to the metallization 202 by wire bond 204. A metal lid 206 is gold/tin soldered to the top of the frame 196, as shown, to hermetically close the package. The metallization 202 is in electrical contact with the lid 206 thereby connecting one end of the diode 190 to one side of the package 194 and the other end of the diode to the other side of the package, namely the base 198. In a similar manner the capacitor 192 is mounted on an insulator and is coupled between the lid 206 and the base 198 thereby providing a parallel connected diode and capacitor in a two port package.

Heat generated by the diode 190 and the capacitor 192 is directly conducted through the metal base 198 which is soldered to the direct bonded copper secondary board 24. In a preferred embodiment the metal base and metal lid are formed of a sintered metal alloy of copper/moly which is manufactured by Sumitomo Electric and referred to as CM-15. The CM-15 has a high electrical and a high thermal conductivity. In the preferred embodiment the lid 206 and the base 198 carry relatively high currents and dissipate heat very efficiently. In the arrangement illustrated the CM-15 lid 206 does not significantly expand when heated and thus reduces clearance as necessary for inserting the hybrid package 50 into the SEM-E chassis 12. The alumina frame 196 is formed of 96% alumina.

Figure 10:
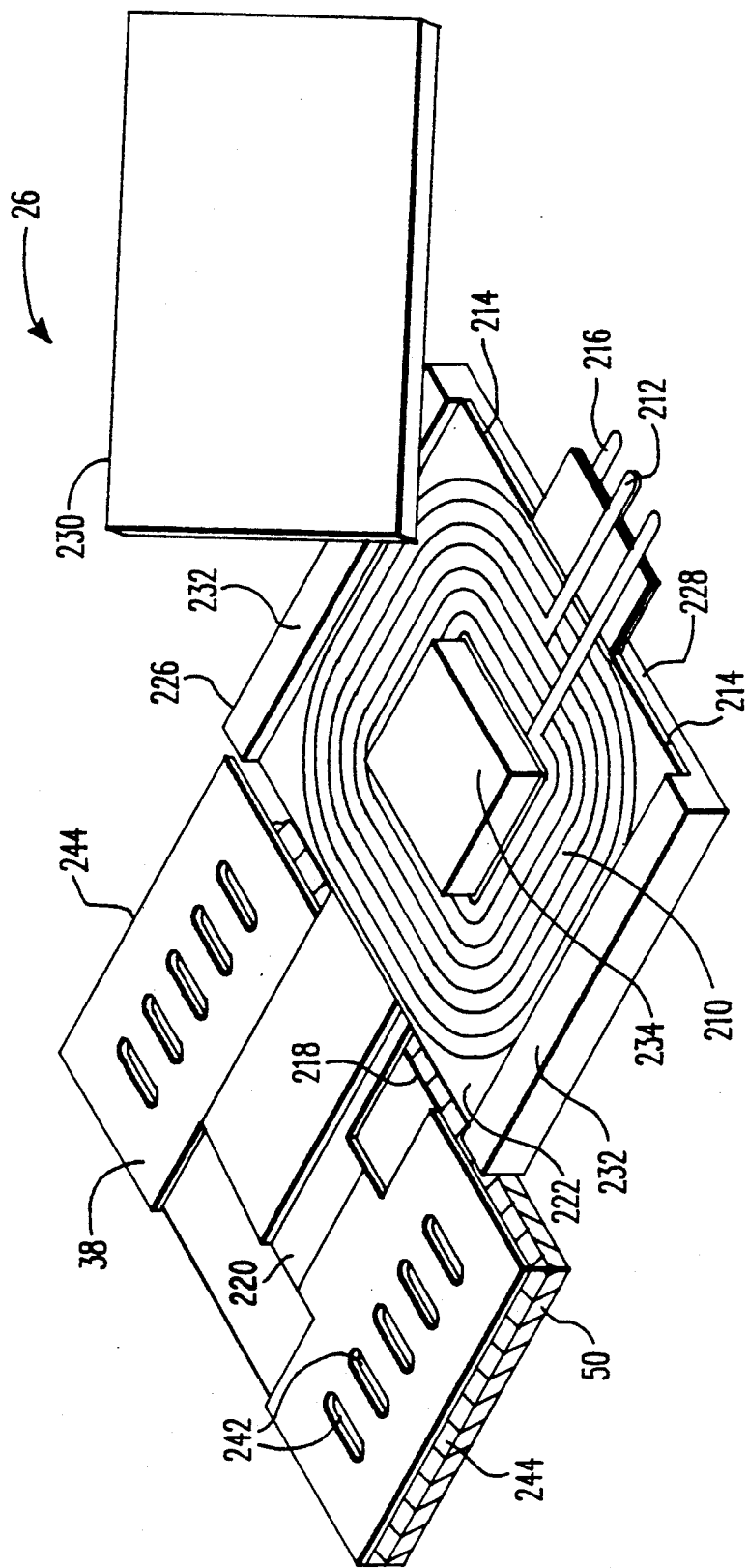
FIG. 10 is a is perspective view of a power transformer employed in the present invention.

Referring now to FIG. 10 there is illustrated in perspective the power transformer 26 previously referred to in FIG. 1. As noted the power transformer 26 comprises one or more primary windings 210 formed of a printed circuit wire 212 disposed on or encapsulated between layers of a flexible insulator 214. The leads 216 are coupled to the primary connectors 32 (FIG. 1). The primary 210 has multiple turns of the planar wire 212 and if desired a plurality of such multi-turn devices may be stacked together to effect a particular primary-to-secondary turns ratio. In the present invention the secondary 218 is similar to the primary 210 except that it is a single turn device formed of a relatively wide printed circuit wire or foil 220 encapsulated in flexible insulator 222. The primary 210 comprising one or more multi-turn devices and the secondary 218 have a central aperture 224. The devices are stacked as shown and disposed within a core member 226 which is formed of a molded or machined base 228 and a cover 230 of suitable magnetically permeable material. The base has three legs including a pair of opposed lateral legs 232 and a central leg 234. The cover 230 is disposed over the base 228 and completes a magnetic circuit through the core including the base 228 and the legs 232 and 234.

The flexible printed windings 212 and 218 with integral flexible insulation 214 fit the machined or molded core 226 in such a way that assembly is relatively easy and device parameters are precise. The geometry of each winding may be precisely determined prior to assembly Components may be tested and the electrical and magnetic properties of the components may be made more consistent from unit to unit.

In a contemplated embodiment of the invention one or more spacers 236 may be disposed or interleaved between the windings 212,218 in order to control interwinding capacitance. The windings 212,218 are designed for relatively high frequency operation in the order of 500 kilohertz and are thus flat in order to take advantage of the skin effect in high frequency applications. In the arrangement illustrated the secondary 218 is capable of carrying about 60 amps of current and the transformer of capable of transferring about 300 watts of power.

Figure 11:
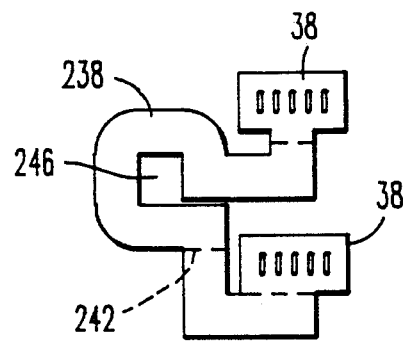
FIGS. 11 and 12 are plan views of various printed wiring preforms employed on the present invention.
Figure 12:
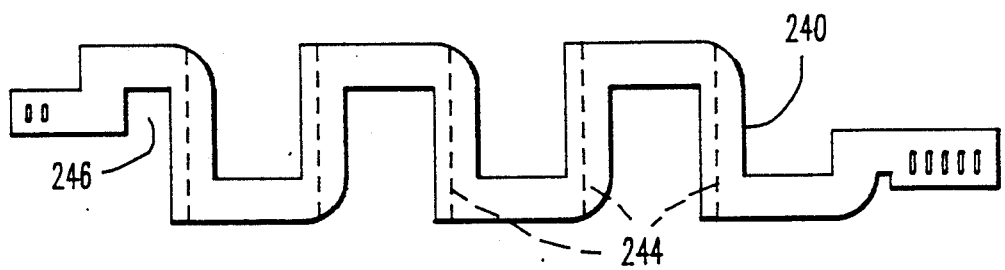

FIGS. 11 and 12 illustrate preforms 238 and 240 respectively. In these arrangements the metal forming the windings, e.g. copper/foil, is preformed as shown and encapsulated in insulation. Thereafter the windings 238 and 240 are folded along respective fold lines 242 and 244 to form a single coil structure (FIG. 11) or a multi-turn coil structure (FIG. 12). The folds should be made so as to result in a winding having a uniform aperture such as 246 which fits over the central core leg 234 (FIG. 10). In a preferred embodiment, the flexible inductor 28 (FIG. 1) is formed in a manner similar to the transformer 26 except that only one single or multi-turn winding is employed.

Figure 9:
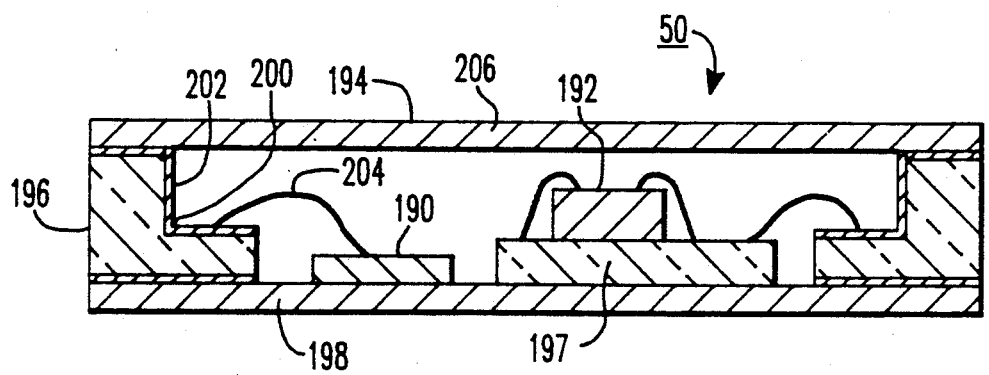
FIG. 9 is a side sectional view of a hybrid rectifier package according to the present invention.

In the various embodiments the high current carrying side of the transformer 26 or the inductor 28 is equipped with relatively large soldering lapped pads or terminations 38 (FIG. 1, FIG. 10). The terminations 38 are elongated metal tabs having a plurality of slots 142 formed therein. These may be directly soldered to the cover 206 of the hybrid rectifier (FIG. 9).

The terminations 38 may be single layer or lapped (stacked) in the case of multiple windings and it is important to provide a sufficiently strong and electrically conductive contact between the power inductor components and the other electrical circuits. To this end the elongated slots 242 are provided in order to increase the fillet length available for soldering the terminations 38 to adjacent structures. In conventional soldering, typically only the perimeter of a termination is available for making an electrical and mechanical bond between structures. In the present invention the perimeter 244 of the termination 38 and the entire internal length of the slots 242 is available to build a fillet 246 both around and internally of the termination 38. The increased fillet length results in a more readily inspectable joint which when correctly applied is both mechanically strong and electrically superior to conventional soldering of large lap joints.

Figure 13:
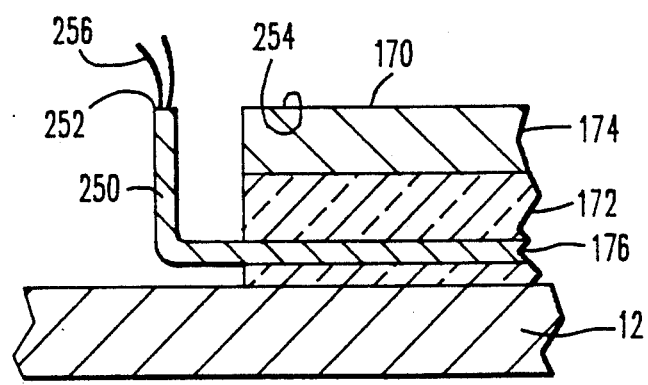
FIG. 13 is a fragmentary side sectional view of a ground connection for the DBC secondary board in FIGS. 7 and 8.

FIG. 13 illustrates another feature of the present invention in which a good ground connection may be provided for the lower copper surface 176 of the direct bonded copper substrate 170 illustrated in FIGS. 7 and 8. In the arrangement of FIG. 13 portions of the top copper layer 174 and the alumina core 172 are removed exposing a length of the lower copper surface 176 which may be bent as shown into an elongated upstanding tab 250. A terminal end 252 of the tab 250 is coplanar with the upper surface 254 of the secondary board 170. The lower copper surface 176 is electrically tied to the chassis with an electrically conductive epoxy over the entire area of the secondary board 170. One or more of the connector pins 256, allocated as secondary output connectors 34 (FIG. 1) may be directly solder bonded to the terminal end 252 of the tab 250 in order to provide a chassis 12 ground pin(s) for the output connector.

Figure 14:
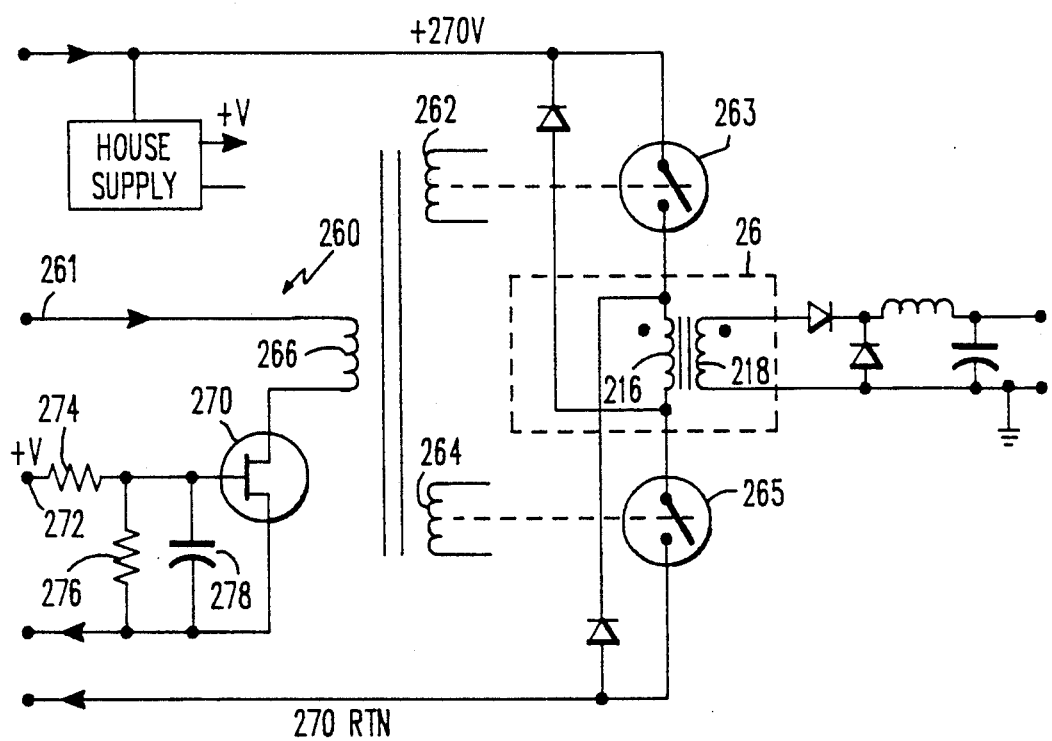
FIG. 14 is a schematic diagram of a safety turn-on circuit for the pulse driver employed in the present invention.

Various electrical circuits are provided in the power supply of the present invention. For example, as illustrated in FIG. 14 a safe turn on/turn off circuit 260 is needed when power is applied or removed from the high current power supply as described herein. Coils 262 and 264 control power switches 263-265 or other downstream solid state circuits, e.g. FETs which are not shown. Typically the switches 263,265 are mounted on the primary board and pulse the primary side of the power transformer 26. The coils 262 and 264 are operated by a pulse drive primary coil 266 which is driven by a pulse width modulated pulse drive signal and which is magnetically coupled to the secondary coils 262 and 264.

In order to prevent damage to switches 263,265, the return leg 268 of the primary coil 266 is coupled to a FET switch 270. The switch 270 or gate is normally held open until the gate voltage 272 set by the voltage divider 274 and the capacitor 276 reaches a selected level. The input (V+) 277 to the divider 274 is provided by low voltage, low power integrated house supply 278 which in turn is powered by primary on/off power 299. In the preferred embodiment the circuit implementation illustrated in FIG. 4 occurs in the return line of the pulse drive transformer 266 located in the primary board 22 on the high voltage, low current side of the power supply. The pulse transformers 262,264 operate the switches 263,265 which in turn pulse the primary side 216 of the transformer 26.

The pulse drive 261 which is controlled by other circuits, hereinafter described, assures that the duty cycle of the switches 263 and 265 is regulated. However, during start-up if the level of the primary power source is not at a desired level or if it significantly drifts the duty cycle may be altered in such a way that the solid state switches 263,265 which are not destroyed. Accordingly, the protection circuit of FIG. 14 prevents inadvertent actuation of the solid state devices until a proper controlled voltage is achieved.

The present invention employs a number of specialized electrical circuits which may be incorporated into an application specific integrated circuit (ASIC). For example, in FIG. 15 a current sharing circuit 280 is provided In order to accommodate large system loads it may be necessary to make use of a plurality of modular power supplies 282-1 . . . 282-n in a parallel configuration. Successful operation depends on the ability of the modules 282-1 . . . 282-n to share current equally between the modules.

Figure 15:
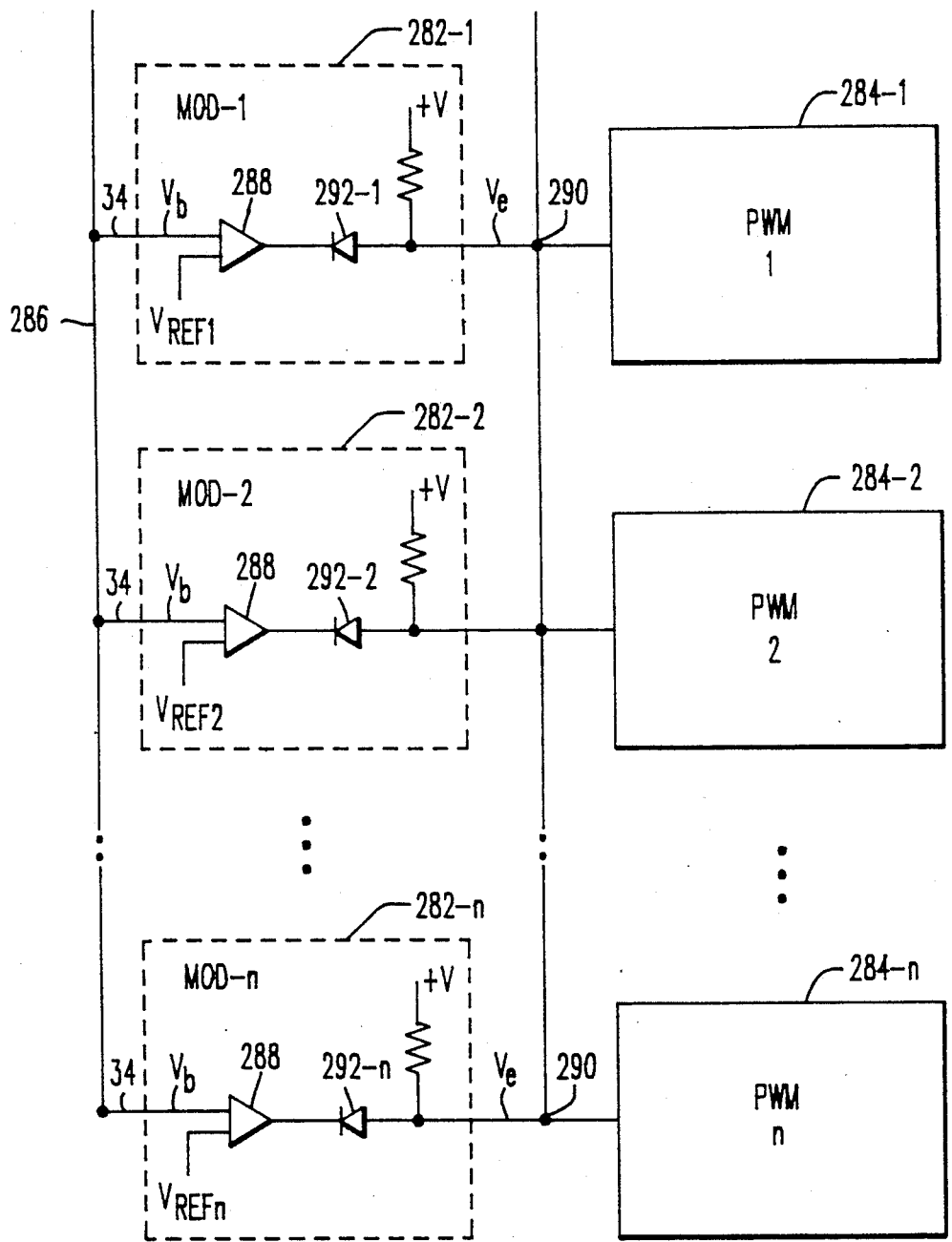
FIG. 15 is a schematic diagram of a current sharing circuit employed between power supplies.

In the arrangement of FIG. 15 the number n of modules is preferably 5. Each power supply or module 282-1 . . . 282-n is controlled by a corresponding pulse width modulator (PWM) 284-1 . . . 284-n which provides the pulse drive 261 referred to in FIG. 14. The output power bus 34 (FIG. 1) for each module 282-1 . . . 282-n is connected to a common bus 286. The common bus voltage $V_b$ is input to an error amplifier 288 in each module 282-1 . . . 282-n. An error signal $V_e$ from each module is coupled to a common error bus 290. The error signal $V_e$ is proportional to a reference voltage $V_{ref1}$. . . $V_{refn}$ for each corresponding module 282-1 . . . 282-n. The error signals $V_e$ are diode ORed by means of diodes 292-1 . . . 292-n to the error bus 290. The highest error signal $V_e$ coupled to the error bus 290 is thus the only control for the pulse width modulators 284-1 . . . 284-n, each of which produces a pulse drive signal 261 for the pulse circuit illustrated in FIG. 14. The important thing to note is that the error voltage $V_e$ being common causes each PWM 284-1 . . . 284-n to produce the same output current. Differences in the reference voltages $V_{ref1}$ . . . $V_{refn}$ or the electrical properties of the various components are eliminated by the current sharing circuit 280 of FIG. 15 because only one controlling error voltage results.

An important feature of the present invention is the incorporation an application specific integrated circuit for integrated control of the power supply illustrated in FIG. 1. Modern low voltage power supplies typically make use of control circuits that maintain regulation, report fault conditions, determine response, monitor overvoltage and undervoltage conditions, provide overload protection, provide system interface and generate drive signals for the power converter stages. These circuits take up valuable room within the power supply, add cost and may lower all overall system reliability, especially when separate components are used. To overcome these difficulties, an application specific integrated circuit including controller circuit 300 of FIG. 16 and selected circuits of FIGS. 14 and 15 have been proved. The control circuit 300 consolidates all the necessary control functions onto a single chip. The integration of the control circuit 300 allows conformance to unique requirements that the power supply must adhere to within the system environment. The device improves upon other previously available controllers in that it may be adapted to various system interfaces and allows numerous power supply topologies including push/pull, forward and fly-back to be employed if so desired.

An input clock signal 302 may be provided to an input receiver 304 which may be configured either as a single ended amplifier, as shown, or a differential receiver (not shown). The output of the receiver 304 is coupled to a phase lock loop (PLL) 306 which is programmable and can run or synchronize in a preferred embodiment up to about 5 megahertz. The output of the PLL 306 is level shifted at 308 and gated through a master/slave flip flop 310 that divides the PLL frequency by two and thereby guarantees a fifty/fifty symmetry of the resulting square wave output 312. The output 312 delivers a power supply clock signal (PSC) on line 314 which is used to synchronize other control functions within the power supply controller 300. The PSC is used to mechanize a fifty percent duty cycle limit function as hereinafter described. The output 312 is also inverted in the inverter 316 to produce inverted PSC$^{-1}$ signal 318 which is coupled to a ramp generator 320 and which produces a fifty percent duty cycle ramp signal 322 that can be used as an input for either a voltage or current mode control. In current mode control a current sense network coupled to the power switches 263,265 (FIG. 14) senses the current therein and produces a ramp voltage analog thereof. The ramp 322 and the ramp 326 are summed in the summing node 328 and coupled to the input 330 of the voltage comparator 332. The summation or level shifting of the ramp 322 with the current sense output 326 allows the control circuit 300 to be used between a Vcc (a fixed bias voltage) and ground. An error voltage operational amplifier 334 compares a voltage reference 336 output VrefI and the error signal $V_e$ described in FIG. 15 to generate a reference for the comparator 332 which in turn produces a pulse width modulated output 338. The comparison of the error signal $V_e$ and the reference voltage 336 produces a current control voltage signal V+ which is compared with the level shifted ramp input 330 to the comparator 332. In other words the output of the comparator 332 is immediately shut down as soon as the input 330 equals V+. The output of the comparator 332 is thus a square wave having a variable pulse width. The output 338 of the comparator 332 drives a flip flop 340 which gates the NOR gate 342. The inverted PSC$^{-1}$ signal 314 drives the flip flop 340 to create a complimentary drive signal in combination with the noninverted PSC signal 314 which drives a second input of NOR gate 342 as shown. The complimentary outputs feed the output amplifiers 344 and 346 which produce the pulse drive signal 261 referred to in FIG. 14. In voltage mode control, the current sense network 324 is not employed and the ramp 322 is simply compared in the comparator 332 directly with the error voltage output of error amplifier 334.

Figure 16:
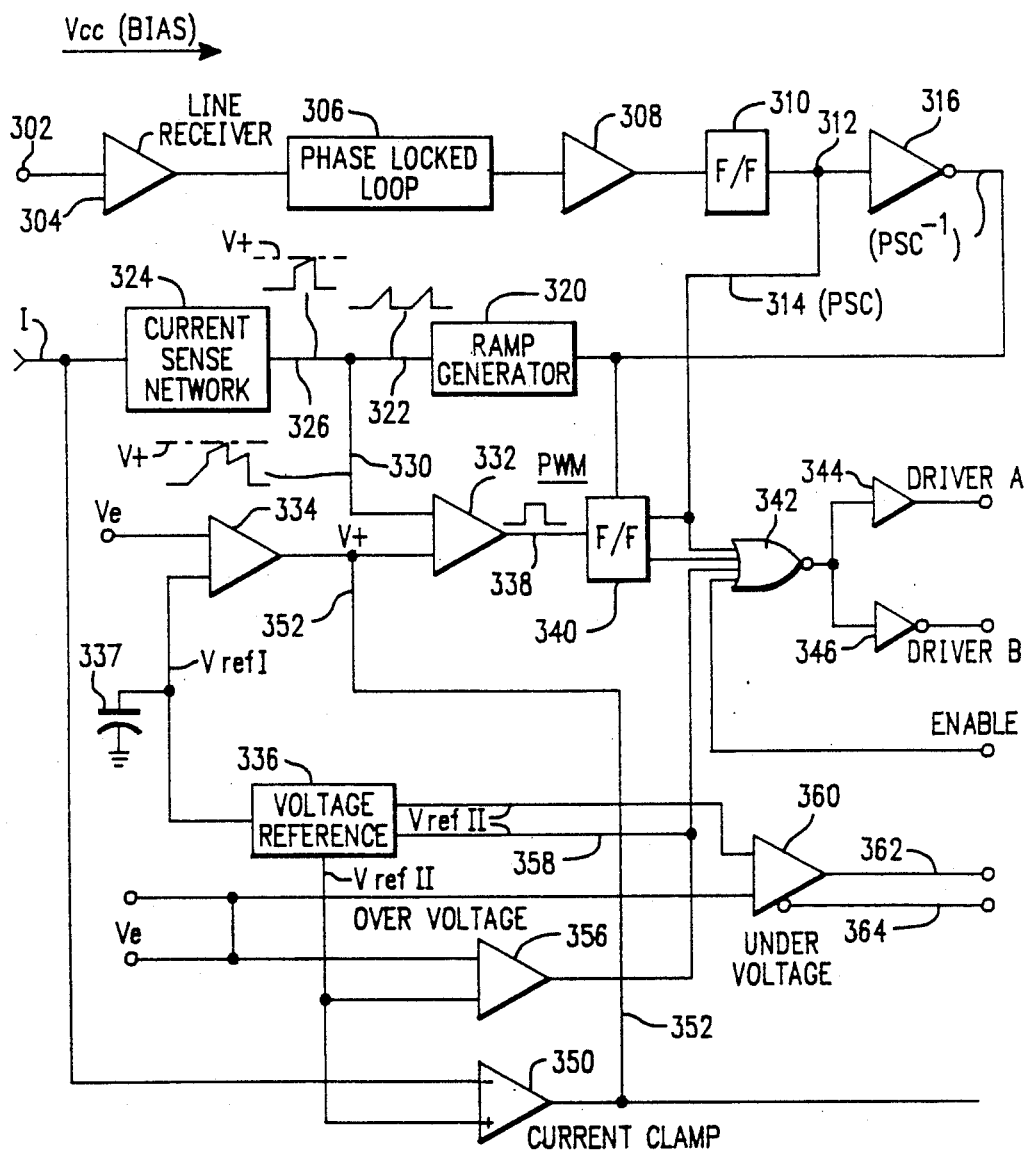
FIG. 16 is an application specific integrated circuit for controlling the various operations of the power supply according to the present invention.

Power supply protection circuitry also resides within the ASIC 300 illustrated in FIG. 16. An internal operational amplifier 350 has one input coupled to reference voltage 336 (VrefII) and its inverting input connected to the current sense network 324. Its output is connected to the output of the error amplifier 334 to limit the excursion of the error amplifier voltage. In overcurrent, the operational amplifier 350 is coupled to and clamps the output of error amplifier 334. This effectively limits the summed input 326 to comparator 332 and thus limits the duty cycle of the PWM signal 338. This operational amplifier 350 could if desired be used as an additional or spare device or other current functions if it is not needed to perform the overcurrent protection.

The circuit 300 has an overvoltage comparator circuit 356 which samples the error voltage $V_e$ and compares it with the voltage reference 336 (VrefII). The comparator disables the NOR gate 342 if an overvoltage condition occurs. The comparator 356 also pulls down the internal reference voltage 336 in the feedback loop 358 to less than 0.1 volt in the event of an overvoltage condition. By pulling the reference 336 down, controlled soft/start can occur when the overvoltage condition abates. In other words a capacitor 337 that is connected to the reference 336 is charged/discharged according to whether an overvoltage condition exists and the feedback loop 358 provides some hysteresis in the system.

Undervoltage comparator 360 compares the reference 336 (VrefII) with the power supply voltage $V_o$ and produces a built in test (BIT) signal in the event of an undervoltage. The BIT signal is a means by which the system is apprised of the undervoltage condition which may be corrected at a later time but which may not be catastrophic. The open collector output 364 of the comparator 360 may be used with TTL logic as desired.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed:

1. A low voltage, high current power supply adapted to be secured within a standard electronic module (SEM) chassis comprising:
   a thick-film multilayer copper and ceramic primary board for supporting relatively low power capacity elements including power switches, a house supply, a regulator, a controller and integral connections therebetween;
   a secondary board formed of a composite of dielectric and direct bonded copper for supporting relatively high power capacity elements including an output rectifier and capacitors and for carrying high output current; and
   inductive power components formed of planar flexible printed metal windings formed on a flexible insulating substrate and a set of monolithic magnetic cores for enclosing the windings therein said windings being connected between selected portions of the primary and secondary boards, the primary board, the secondary board and the inductive power components being directly bonded in thermal contact with the chassis.

2. The power supply of claim 1 wherein the thick film copper ceramic primary board comprises at least one film of selectively apertures dielectric and copper formed in the apertures forming thermal vias alternating with a thick copper patterned film on the dielectric which pattern corresponds to the thermal vias and a supporting substrate therefor.

3. The power supply of claim 2 further comprising a leadless chip carrier (LCC) including a gold film formed in a pattern on a rear surface thereof, the pattern of which corresponds to the location of the thermal vias, said LCC being solder bonded by the gold film to the copper film.

4. The power supply of claim 3 wherein the LCC comprises an aluminum nitride thermal base for supporting an integrated circuit on one side thereof and being patterned with the gold film on the opposite side thereof and an alumina apertured ring being bonded to the aluminum nitride by a copper gold braze.

5. The power supply of claim 3 wherein the LCC comprises a copper/tungsten thermal base for supporting an integrated circuit on one side thereof and the gold film on the opposite side thereof and an apertured stepped alumina ring for receiving the thermal pad therein and being bonded thereto by a gold/copper braze on the chip side.

6. The power supply of claim 1 wherein the direct bonded copper secondary board comprises an alumina core and directly bonded copper surfaces, one copper surface for surface mounting capacitors and at least one rectifier hybrid package and being a thickness sufficient to carry a relatively high current, the opposite copper surface being a thickness sufficient to spread and conduct heat to the SEM chassis from the hybrid.

7. The power supply of claim 6 wherein the hybrid package comprises an alumina stepped ring and a thermally and electrically conductive base being copper/gold brazed to the one side of the ring and a cover being silver tin soldered to the opposite side of the ring, the base for supporting a gold/germanium soldered diode in electrical contact therewith, and an alumina support gold/germanium soldered to the base for supporting a capacitor in parallel circuit configuration with the diode but insulated from the base, metallization in the step being coupled to the cover and in parallel with the capacitor and diode.

8. The power supply of claim 1 wherein the inductive power components include an inductor comprising at least one layer of the flexible printed windings and the flexible insulating substrate encapsulating the windings; and
   a magnetic core being formed of monolithic portions for receiving the windings therein.

9. The power supply of claim 8 wherein the power inductors include spacers between the windings for reducing interwinding capacitance.

10. The power supply of claim wherein the inductive power components include stacked primary and secondary windings on the core.

11. The power supply of claim wherein the primary board, the secondary board and the inductive components are bonded to a planar surface of the SEM with a heat conductive epoxy.

12. The power supply of claim 7 wherein the hybrid package is hermetically sealed.

13. The power supply of claim 9 wherein the inductor comprises a continuous conductor being folded on itself on the core.

* * * * *

UNITED STATES PATENT AND TRADEMARK OFFICE
CERTIFICATE OF CORRECTION

PATENT NO. : 5,027,255
DATED : June 25, 1991
INVENTOR(S) : Dan B. Zeitlin, et al.

It is certified that error appears in the above-identified patent and that said Letters Patent is hereby corrected as shown below:

Title page, delete item [30], the claim to Foreign Priority.

Signed and Sealed this

Fourteenth Day of April, 1998

Attest:

BRUCE LEHMAN

Attesting Officer     Commissioner of Patents and Trademarks